(12) United States Patent
Chen et al.

(10) Patent No.: US 12,387,943 B2
(45) Date of Patent: Aug. 12, 2025

(54) STRUCTURE FOR EMBEDDED GETTERING IN A SILICON ON INSULATOR WAFER

(71) Applicant: Taiwan Semiconductor Manufacturing Co., Ltd., Hsinchu (TW)

(72) Inventors: Pu-Fang Chen, Hsinchu (TW); Shi-Chieh Lin, Hsinchu (TW); Victor Y. Lu, Foster City, CA (US); Yeur-Luen Tu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 165 days.

(21) Appl. No.: 17/562,247

(22) Filed: Dec. 27, 2021

(65) Prior Publication Data

US 2022/0122849 A1    Apr. 21, 2022

Related U.S. Application Data

(62) Division of application No. 15/958,385, filed on Apr. 20, 2018, now Pat. No. 11,211,259.

(51) Int. Cl.
| | |
|---|---|
| *H01L 21/322* | (2006.01) |
| *H01L 21/762* | (2006.01) |
| *H10D 86/00* | (2025.01) |

(52) U.S. Cl.
CPC .... *H01L 21/3226* (2013.01); *H01L 21/76251* (2013.01); *H10D 86/201* (2025.01)

(58) Field of Classification Search
CPC ........... H01L 21/3226; H01L 21/76251; H01L 27/1203

USPC ......................................................... 257/347
See application file for complete search history.

(56) References Cited

U.S. PATENT DOCUMENTS

| | | | |
|---|---|---|---|
| 5,920,013 A | 7/1999 | Boardman et al. | |
| 6,749,684 B1 | 6/2004 | Chen et al. | |
| 6,841,457 B2 | 1/2005 | Bedell et al. | |
| 7,923,353 B2 * | 4/2011 | Makinen | H01L 21/3226 |
| | | | 438/58 |
| 8,017,998 B1 * | 9/2011 | Banna | H01L 21/3226 |
| | | | 438/470 |

(Continued)

FOREIGN PATENT DOCUMENTS

| | | | |
|---|---|---|---|
| CN | 1492476 A | 4/2004 | |
| CN | 105190835 A | 12/2015 | |
| JP | 2011249397 A | * 12/2011 | ......... H01L 21/3221 |

OTHER PUBLICATIONS

Godbey et al., "Selective Removal of Si1-x Gex from (100) Si Using HNO3 and HF," J. Electrochem. Soc., vol. 139, No. 10, Oct. 1992, pp. 2943-2947.

*Primary Examiner* — Jami Valentine Miller
(74) *Attorney, Agent, or Firm* — Slater Matsil, LLP

(57) ABSTRACT

A representative method of manufacturing a silicon-on-insulator (SOI) substrate includes steps of depositing an etch stop layer on a dummy wafer, growing an epitaxial silicon layer on the etch stop layer, forming a gettering layer on the epitaxial silicon layer, bonding a buried oxide layer of a main wafer to the gettering layer, and removing the dummy wafer and etch stop layer to expose the epitaxial silicon layer. The SOI substrate has an epitaxial silicon layer adjoining the gettering layer, with the gettering layer interposed between the buried oxide layer and the epitaxial silicon layer.

20 Claims, 7 Drawing Sheets

(56) References Cited

U.S. PATENT DOCUMENTS

| | | | |
|---|---|---|---|
| 9,741,603 B2 | 8/2017 | Tobisaka et al. | |
| 2005/0003229 A1 | 1/2005 | Bedell et al. | |
| 2009/0050941 A1* | 2/2009 | Yamazaki | H01L 21/84 |
| | | | 257/E29.004 |
| 2009/0092810 A1* | 4/2009 | Lee | H01L 21/76254 |
| | | | 117/2 |
| 2009/0189159 A1* | 7/2009 | Enicks | H01L 21/3221 |
| | | | 257/E21.317 |
| 2010/0019385 A1 | 1/2010 | Bartley et al. | |
| 2011/0298083 A1* | 12/2011 | Yoneda | H01L 21/3226 |
| | | | 257/506 |
| 2015/0064852 A1* | 3/2015 | Wakimoto | H01L 29/7395 |
| | | | 438/138 |
| 2019/0043709 A1 | 2/2019 | Chu et al. | |
| 2019/0326128 A1* | 10/2019 | Chen | H01L 21/3226 |

* cited by examiner

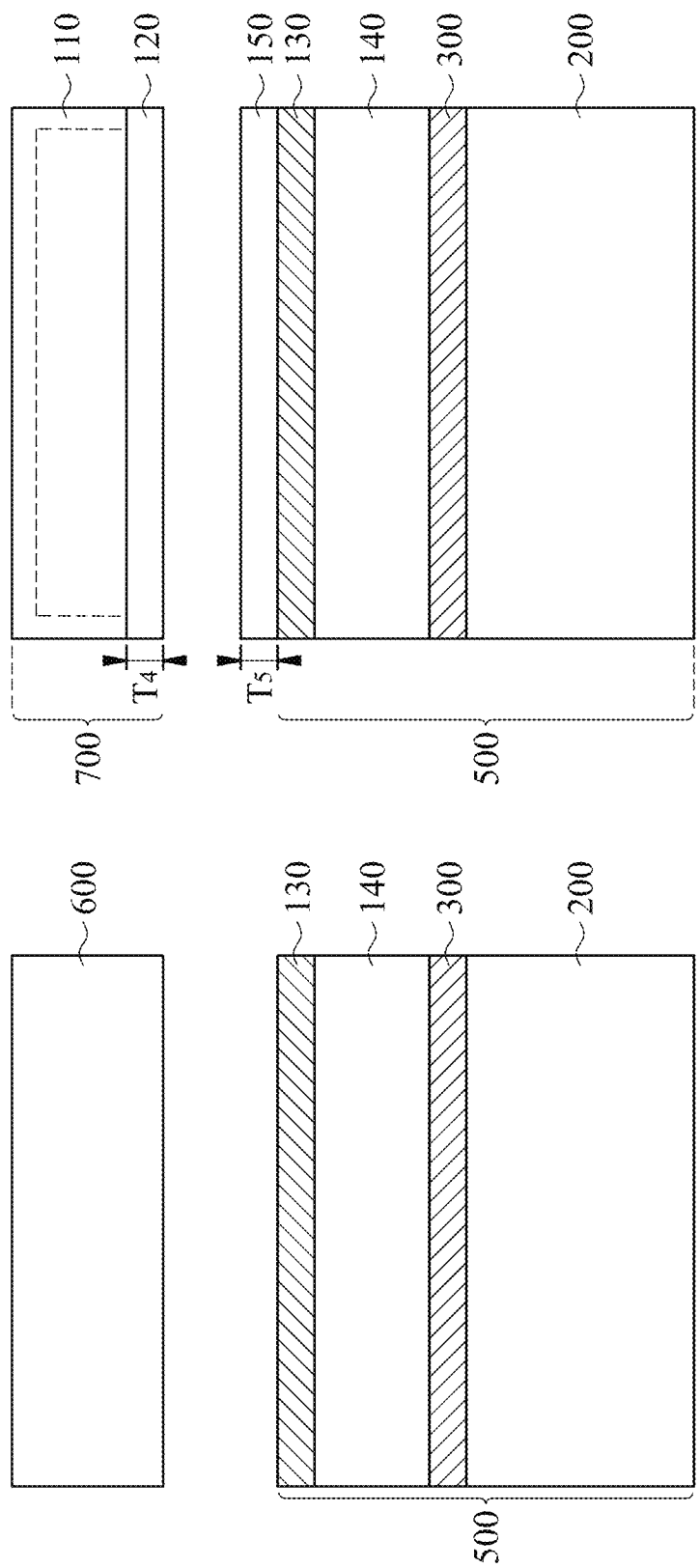

STRUCTURE FOR EMBEDDED GETTERING IN A SILICON ON INSULATOR WAFER

PRIORITY CLAIM AND CROSS-REFERENCE

This application is a division of U.S. patent application Ser. No. 15/958,385, filed on Apr. 20, 2018 entitled "Structure and Method for Embedded Gettering in a Silicon on Insulator Wafer," which application is hereby incorporated herein by reference.

BACKGROUND

Generally, semiconductor devices provide active components (e.g., transistors, diodes, or the like) that may be used to generate desired structural and functional parts of a design. The components are typically formed within or on a silicon substrate. Any number of interconnect layers may be formed over the substrate that connect components to each other and to other devices. The interconnect layers may be fabricated from dielectric layers with metallic lines, trenches, or vias disposed therein. For example, metallization layers may be formed over active devices, and may be configured to connect various active devices to form functional circuitry for a particular design. The metallization layers may be formed of alternating layers of dielectric and conductive materials, and may be formed through any suitable process (e.g., deposition, damascene, dual damascene, or the like). Sometimes, silicon on insulator (SOI) substrates are used in place of conventional silicon substrates in the fabrication of semiconductor devices.

BRIEF DESCRIPTION OF THE DRAWINGS

Aspects of the present disclosure may be understood from the following detailed description when read in conjunction with the accompanying Figures. It is noted that, in accordance with standard practice in the industry, various features may not be illustrated to scale. For example, dimensions of various features may be arbitrarily increased or reduced for clarity of discussion or illustration.

FIGS. 2-9 representatively illustrate elevation cross-sectional views of intermediate steps in the manufacture of an SOI structure, in accordance with some embodiments.

DETAILED DESCRIPTION

Figure 1:
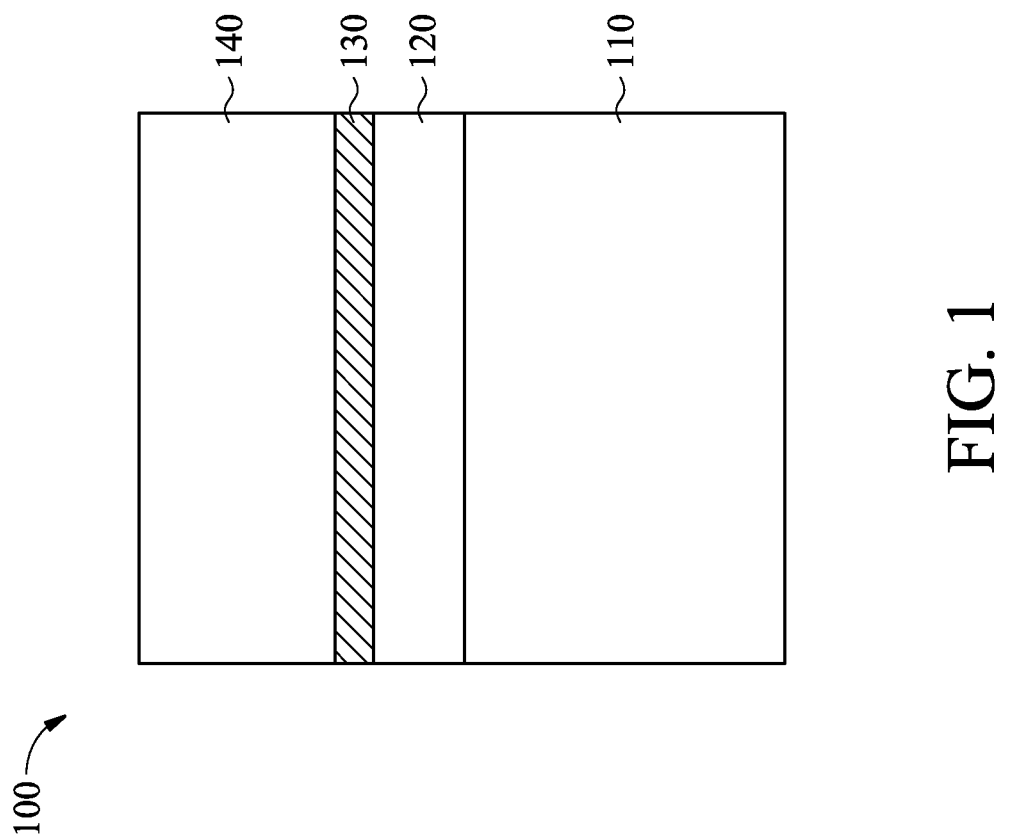
FIG. 1 representatively illustrates an elevation cross-sectional view of a silicon on insulator (SOI) structure, in accordance with some embodiments.

The following disclosure provides different embodiments, or examples, for implementing different features. Specific examples of components and arrangements are described below to simplify the present disclosure. These are, of course, merely examples and are not intended to be limiting. For example, the formation of a first feature "over" or "on" a second feature, in the description that follows, may include embodiments in which first and second features are formed in direct contact (e.g., adjoining), and may also include embodiments in which additional features may be formed between first and second features, such that the first and second features may not be in direct contact. Additionally, the present disclosure may repeat reference numerals or letters in various examples. Such repetition is for brevity and clarity, and does not of itself dictate a relationship between various embodiments or configurations discussed herein.

Furthermore, spatially relative terms, such as "beneath," "below," "lower," "lowermost," "above," "upper," "uppermost," or the like, may be used herein for ease of description; e.g., to reference a spatial relationship between one element or feature and another element or feature. Spatially relative terms are intended to encompass different orientations of a device in use or operation, in addition to orientations illustrated in the Figures. An apparatus may be otherwise oriented (e.g., rotated by 27°, 90°, 180°, or at other orientations) and the spatially relative descriptors used herein may likewise be interpreted accordingly.

Silicon on insulator (SOI) technology refers to the use of silicon—insulator—silicon substrates in place of conventional silicon substrates in semiconductor manufacturing. SOI-based devices differ from conventional silicon devices in that the silicon junction is above an electrical insulator; e.g., silicon dioxide or sapphire. The choice of insulator depends at least in part on the intended application of the device; with sapphire being used, e.g., for high-performance radio frequency (RF) and radiation-sensitive applications, and silicon dioxide being used, e.g., for diminished short channel effects in microelectronics devices. Compositions of the insulating layer and topmost silicon layer also vary widely with application.

Silicon on insulator substrates provide advantages in that good electrical characteristics (e.g., as representatively discussed above) can be achieved, and that a uniform silicon layer can be formed; however, metal contamination can be an issue. For example, diffusion coefficients of metal impurities (e.g., transition metals, such as Fe, Cu, Ni, and Cr, heavy metals, and noble metals) in silicon are greater than those in silicon oxide films. Additionally, oxides of such metal impurities can be chemically stable and difficult to remove.

However, the presence of metal contaminants may induce a crystal defect cause a junction leakage in a PN-junction, or an insulation breakdown in the oxide layer. Such defects can damage electrical properties or affect reliability of the semiconductor device. For example, in an embodiment in which an SOI is utilized in an image sensor device, the presence of metal impurities may cause electric charge to locally accumulate, resulting in a white spot (or "hot pixel") defect.

FIG. 1 representatively illustrates a silicon on insulator structure 100 configured to trap and remove metal impurities, in accordance with some embodiments. Silicon on insulator structure 100 includes a substrate 110 (representatively illustrated in FIG. 1 as a substrate portion of a silicon on insulator wafer), a first buried oxide layer 120 (e.g., silicon oxide (SiO2)), a gettering layer 130 (representative compositions of which are discussed in greater detail herein, with reference to its deposition), and an epitaxial layer 140 (e.g., epi-Si). In some embodiments epitaxial layer 140 is over, on, and adjoins an uppermost surface of gettering layer 130, gettering layer 130 is over, on, and adjoins an uppermost surface of first buried oxide layer 120, and first buried oxide layer 120 is over, on, and adjoins an uppermost surfaced of substrate 110. Gettering layer 130 is interposed between and adjoins a lowermost surface of epitaxial layer 140 and an uppermost surface of first buried oxide layer 120. First buried oxide layer 120 is interposed between and adjoins a lowermost surface of gettering layer 130 and an uppermost surface of substrate 110.

Figure 2:
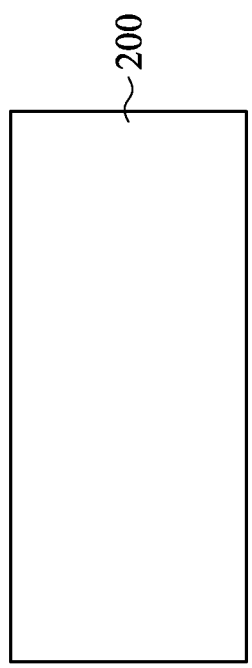

FIGS. 2-9 representatively illustrate intermediate steps in the manufacture of silicon on insulator structure 100, in accordance with some embodiments. For example, FIG. 2 illustrates a dummy substrate 200 (or carrier/support wafer portion), in accordance with some embodiments. In representative implementations, dummy substrate 200 may be provided as a monocrystalline silicon substrate. However, other materials may be used for dummy substrate 200. For example, in place of a monocrystalline silicon substrate, a glass substrate or a resin substrate may be used.

Figure 3:
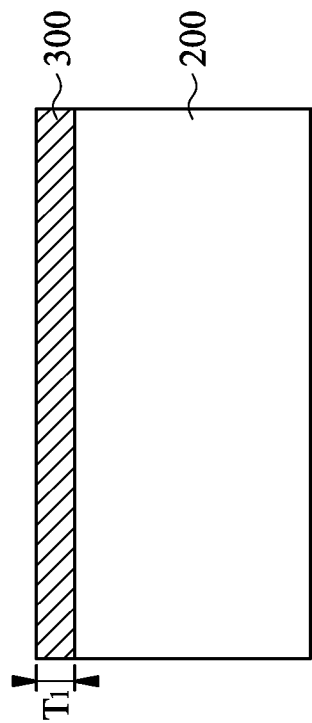

FIG. 3 representatively illustrates formation of a stop layer 300 (e.g., an etch stop layer) over, on, and adjoining an uppermost surface of dummy substrate 200, in accordance with some embodiments. Stop layer 300 serves to improve controllability of a removal of dummy substrate 200, and exposure of epitaxial layer 140 in subsequent processing steps. In a representative aspect, stop layer 300 may serve as a polishing stop layer. In some embodiments, stop layer 300 comprises silicon germanium, and may be deposited on dummy substrate 200 with chemical vapor deposition (CVD), plasma-enhanced chemical vapor deposition (PECVD), remote plasma chemical vapor deposition (RPCVD), or other suitable deposition methods. In representative applications, the stop layer 300 may be formed to a first thickness $T_1$ of between about 500 Å and about 2000 Å, such as about 1350 Å. However, any suitable process and thickness may be utilized.

In another embodiment the stop layer 300 may be formed utilizing an epitaxial process such as an epitaxial growth process. For example, in an embodiment in which the stop layer 300 comprises silicon germanium, the stop layer 300 may be formed as an epitaxial layer. When the stop layer 300 is formed as an epitaxial layer, the subsequently formed epitaxial layer 140 (described further below) may be grown utilizing the crystalline structure of the stop layer 300. However, any suitable process may be utilized.

Figure 4:
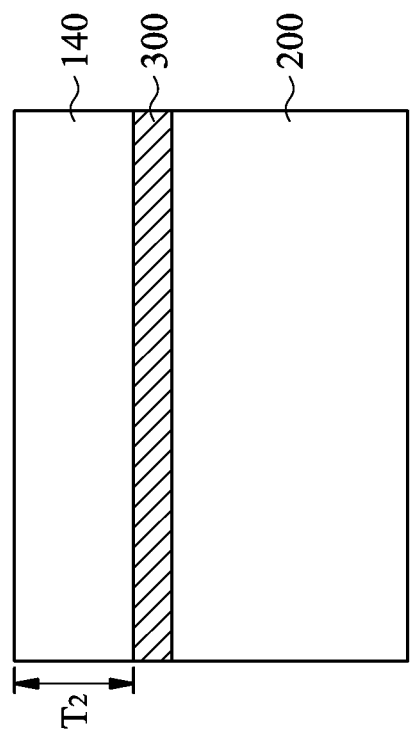

FIG. 4 representatively illustrates formation of epitaxial layer 140 over, on, and adjoining an uppermost surface of stop layer 300, in accordance with some embodiments. Stop layer 300 is interposed between and adjoins a lowermost surface of epitaxial layer 140 and an uppermost surface of dummy substrate 200. In an embodiment the epitaxial layer 140 will be used as the active layer for the SOI substrate and, as such, is formed of a semiconductor material such as silicon, silicon germanium, combinations of these, or the like.

In an embodiment in which the epitaxial layer 140 is silicon, the epitaxial layer 140 may be formed using, e.g., an epitaxial growth process that utilizes one or more precursor materials. Examples of a silicon source gas that can be used for growing epitaxial silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) may be used. With respect to conditions for epitaxial growth, either of atmospheric-pressure chemical vapor deposition (CVD) or low-pressure chemical vapor deposition (LPCVD) may be used. In representative applications, a substrate temperature of between about 500° C. and about 800° C. may be used.

The epitaxial growth may proceed for a duration of time between about 600 seconds and about 30 minutes. Such a time under such process conditions can be used to form the epitaxial layer 140 to a second thickness $T_2$ of between about 500 Å and about 2000 Å, such as about 1350 Å. However, any suitable thickness may be utilized.

Figure 5:
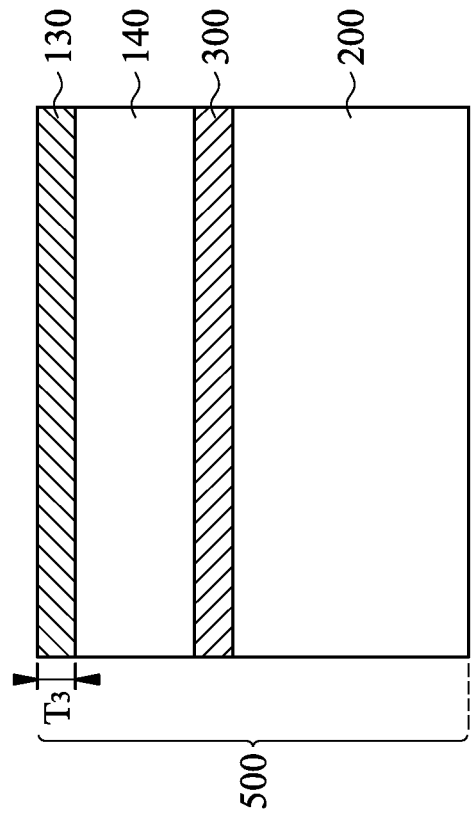

FIG. 5 representatively illustrates formation of gettering layer 130 over, on, and adjoining an uppermost surface of epitaxial layer 140, in accordance with some embodiments. Epitaxial layer 140 is interposed between and adjoins a lowermost surface of gettering layer 130 and an uppermost surface of stop layer 300. At the conclusion of the manufacturing step representatively illustrated in FIG. 5, a first wafer 500 is provided for additional processing.

Since no semiconductor device will be formed in or connecting to gettering layer 130, gettering layer 130 may have any crystalline or non-crystalline quality. That is to say, in an embodiment in which the gettering layer 130 is silicon, the gettering layer 130 may include monocrystalline silicon, non-crystalline (e.g., amorphous) silicon, polycrystalline silicon (p-Si), or a mixture of non-crystalline silicon and polycrystalline silicon. Silicon comprising gettering layer 130 can take various forms depending on the manufacturing method employed to produce gettering layer 130. In other embodiments, gettering layer 130 may comprise one or more polysilicon films, one or more nitride films, one or more oxynitride films, one or more silicon germanium films, polysilicon (p-Si), a nitride material (e.g., SiN), an oxynitride material (e.g., SiON), silicon germanium (SiGe), or the like. However, any suitable material may be utilized to getter impurities.

In accordance with embodiments in which the gettering layer 130 is silicon, gettering layer 130 may be deposited with chemical vapor deposition (CVD), plasma-enhanced chemical vapor deposition (PECVD), or other suitable deposition methods. The silicon may crystalline, amorphous silicon, polycrystalline silicon, combinations of these, or the like. If silicon crystals comprising gettering layer 130 have a disordered configuration (e.g., surface defects, dangling bonds, lattice defects or distortions, dislocations, imperfect bonding, crystal grain boundaries, or the like), such a disordered configuration may serve as a gettering site, or otherwise contribute to improvement of gettering function.

In accordance with other embodiments, gettering layer 130 may comprise a silicon germanium (SiGe) film. In such an embodiment, the SiGe film may be deposited with chemical vapor deposition (CVD), plasma-enhanced chemical vapor deposition (PECVD), or other suitable deposition methods. The germanium (Ge) concentration of gettering layer 130 comprising silicon germanium (SiGe) may be between about 10% to about 30%. However, any suitable concentration may be utilized. In embodiments in which the gettering layer 130 comprises silicon germanium, the silicon crystal lattice will be distorted by the inclusion of the germanium, with the distortion functioning as a gettering site.

In accordance with other embodiments, gettering layer 130 may comprise a silicon nitride (SiN) film. The SiN film may be deposited with chemical vapor deposition (CVD), plasma-enhanced chemical vapor deposition (PECVD) or other deposition techniques. The nitrogen (N) concentration of gettering layer 130 comprising silicon nitride (SiN) may be between about $1E22$ atoms/cm$^3$ to about $1E24$ atoms/cm$^3$. However, any suitable concentration may be utilized. Similarly, if gettering layer 130 comprises a nitride (—N), nitrogen (N) operates to increase the density of metal agglomeration sites—thereby improving gettering function.

In accordance with other embodiments, gettering layer 130 may comprise a silicon oxynitride (SiON) film. The SiON film may be deposited with chemical vapor deposition (CVD), plasma-enhanced chemical vapor deposition (PECVD) or other deposition techniques. The nitrogen (N) concentration of gettering layer 130 comprising silicon oxynitride (SiON) may be between about $1E20$ atoms/cm$^3$ to about $1E22$ atoms/cm$^3$, while the oxygen (O) concentration of gettering layer 130 comprising silicon oxynitride may be between about $1E22$ atoms/cm$^3$ and about $1E24$ atoms/cm$^3$.

However, any suitable concentrations may be utilized. Similarly, if gettering layer 130 comprises a nitride (—N) and oxynitride (—ON), nitrogen (N) operates to increase the density of metal agglomeration sites—thereby improving gettering function.

Generally, the thicker gettering layer 130 is, the greater the total amount of metal contaminants that may be sequestered in gettering layer 130, while the thinner gettering layer 130 is, the smaller the total amount of metal contaminants that may be gettered. Accordingly, a sufficient thickness of gettering layer 130 should be provided to achieve a sufficient gettering potential. In representative applications, the thickness of gettering layer 130 is about equal to or thinner than epitaxial layer 140. In a representative aspect, gettering layer 130 and epitaxial layer 140 are configured to have unaligned silicon structures or differing material compositions—for example, to induce a disordered configuration at the boundary between gettering layer 130 and epitaxial layer 140. In a particular embodiment, the gettering layer 130 may be formed to a third thickness $T_3$ of between about 100 Å and about 1000 Å, such as about 300 Å. However, any suitable thickness may be utilized.

FIG. 6 illustrates provision of a bulk main substrate 600, in accordance with some embodiments. In representative applications, bulk main substrate 600 may be provided as a monocrystalline silicon substrate that will subsequently form a silicon layer of silicon on insulator structure 100 (see FIG. 1) in further processing. For example, bulk main substrate 600 may be provided as a result of using the Czochralski process to produce a monocrystalline silicon wafer.

Bulk main substrate 600 may be doped with boron (B), oxygen (O), or other elements. For example, in a representative application, bulk main substrate 600 may be doped with a concentration of between about 5E15 atoms/cm$^3$ and about 6E18 atoms/cm$^3$ of boron (B). In another embodiment, bulk main substrate 600 may be doped with a concentration of between about 1E16 atoms/cm$^3$ and about 8E18 atoms/cm$^3$ of oxygen (O). However, any suitable concentrations may be utilized.

FIG. 7 representatively illustrates an oxidation of bulk main substrate 600 to form a first buried oxide layer 120, in accordance with some embodiments. Alternatively, second wafer 700 may be commercially provided with first buried oxide layer 120 already disposed therein. In an embodiment the oxidation may be a thermal oxidation which produces a thin layer of oxide (usually silicon dioxide ($SiO_2$)) on the surface of a wafer, by forcing an oxidizing agent to diffuse into the wafer at high temperature and react with it. Generally, thermal oxidation is performed in furnaces at elevated temperatures between about 800° C. and about 1200° C. and in the presence of an oxidizing agent such as water, steam, oxygen, ozone, combinations of these, or the like. The thickness of first buried oxide layer 120 may be selected depending on what semiconductor device is to be manufactured with silicon on insulator structure 100. In some embodiments, the first buried oxide layer 120 may be formed to have a fourth thickness $T_4$ of between about 2000 Å and about 5000 Å, such as about 3500 Å. However, any suitable thickness may be utilized.

In some embodiments, additional materials may also be added during the oxidizing process in order to help control the process. For example, in some embodiments hydrochloric acid (HCl) or trichloroethylene ($C_2HCl_3$) may be added to the oxidizing medium in an effort to increase the rate of oxidation. The presence of chlorine will also have the added effect of immobilizing labile metal ions, such as sodium (Na) by forming sodium chloride. Such an immobilization can help to reduce or prevent a degradation of device performance because of the presence of unreacted labile metal ions.

First buried oxide layer 120 represents a thermally oxidized portion of bulk main substrate 600. Substrate 110 is an unoxidized portion of bulk main substrate 600. First buried oxide layer 120 is over, on, and adjoins substrate 110. At the conclusion of the manufacturing step illustrated in FIG. 7, a second wafer 700 (including first buried oxide layer 120) is provided for subsequent processing.

FIG. 7 also illustrates an oxidation of the first wafer 500. In an embodiment the first wafer 500 may be oxidized in a manner similar to the bulk main substrate 600. For example, the first wafer 500 may be oxidized using, e.g., a thermal oxidation at elevated temperatures and an oxidizing environment in which oxygen is driven into and reacts with the exposed surfaces of the first wafer 500 to form a second oxide layer 150. The second oxide layer 150 may be formed to a fifth thickness $T_5$ of between about 2000 Å and about 5000 Å, such as about 4000 Å. However, any suitable process and thickness may be utilized.

However, by forming the first buried oxide layer 120, and notwithstanding the gettering ability of bulk micro defects (BMDs) included in bulk main substrate 600 (later processed to form substrate 110 of silicon on insulator structure 100), any metal contaminants will be impeded from being able to transit through first buried oxide layer 120 (as discussed above) to be sequestered in gettering sites associated with the bulk micro defects (BMDs). Consequently, any gettering benefit that could otherwise be realized by virtue of the presence of bulk micro defects (BMDs) in bulk main substrate 600 will be eliminated or otherwise substantially reduced. Accordingly, gettering layer 130 is configured to provide sequestration of metal contaminants without requiring transit of the metal contaminants across first buried oxide layer 120. As a result, silicon on insulator structure 100 may be provided to a semiconductor device fabrication process with a substantially reduced or otherwise eliminated population of bulk micro defects (BMDs) in substrate 110—and, therefore, may be formed at lower temperatures than would otherwise be employed to produce, e.g., a large population of oxygen precipitation sites, or other BMDs.

Additionally, while the oxidation processes described above have been illustrated as forming the first buried oxide layer 120 on a single side of the bulk main substrate 600 and forming the second oxide layer 150 on a single side of the first wafer 500, this is intended for illustration only and is not intended to be limiting to the embodiments. Rather, in other embodiments, the first buried oxide layer 120 may be formed on each exposed surface of the bulk main substrate 600 and the second oxide layer 150 (represented in FIG. 7 by the dashed line) may be formed on each exposed surface of the first wafer 500 (including oxidized portions of the gettering layer 130, the stop layer 300, and the dummy substrate 200).

Figure 8:
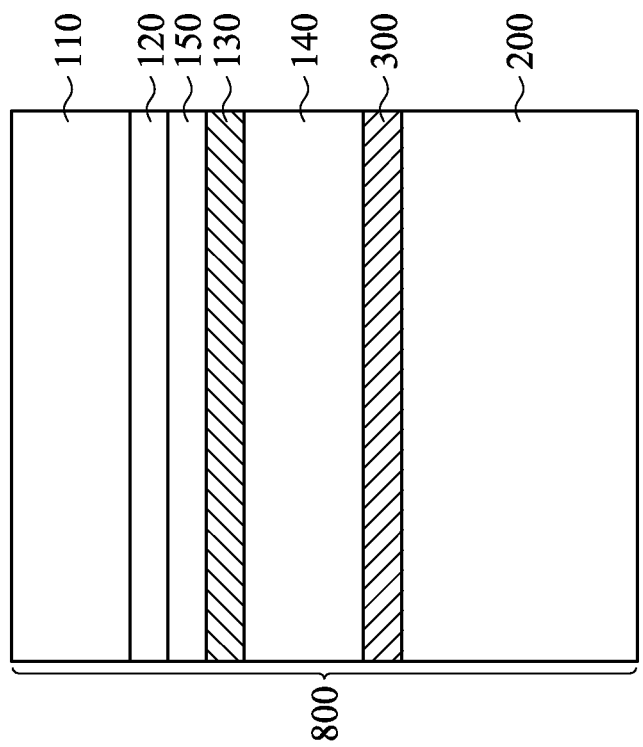

FIG. 8 representatively illustrates bonding of first wafer 500 to second wafer 700 to form bonded wafers 800, in accordance with some embodiments. In an embodiment the bonding may be performed using any suitable bonding technique, such as by oxide fusion bonding, although any other suitable bonding processes, such as silicon-on-glass bonding, direct wafer-to-wafer bonding, hybrid bonding, or the like, may also be utilized. In an embodiment in which fusion bonding is utilized, once first buried oxide layer 120 and second oxide layer 150 have been formed, the fusion bonding process may be initiated by first aligning the first wafer 500 and the second wafer 700 and then contacting the first wafer 500 and the second wafer 700 together to initiate a bonding of the first wafer 500 with the second wafer 700.

Once the bonding has been initiated by contacting the first wafer 500 and the second wafer 700, the bonding process may be continued to strengthen the bonding by heating the first wafer 500 and the second wafer 700. In an embodiment this heating may be performed by annealing the first wafer 500 and the second wafer 700 at a temperature of between about 300° C. and about 400° C. in order to strengthen the bond. The annealing process may be performed for a time of between about 1 hour and about 3 hours. However, any suitable method for strengthening the bond, including allowing the first wafer 500 and the second wafer 700 to bond at room temperature, may alternatively be used, and all such bonding is fully intended to be included within the scope of the embodiments.

In another embodiment, a wet cleaning procedure may be utilized to help activate and initiate the fusion bond between the first wafer 500 and the second wafer 700. For example, first buried oxide layer 120 and second oxide layer 150 may be bonded by initially cleaning first buried oxide layer 120 and second oxide layer 150 using, e.g., a wet cleaning procedure such as an SC-1 or SC-2 cleaning procedure to form one or more hydrophilic surfaces. First buried oxide layer 120 is then aligned with second oxide layer 150 and the two are contacted together to begin the bonding procedure. Once first buried oxide layer 120 has contacted second oxide layer 150, the thermal anneal may be utilized to strengthen the bond.

In yet another embodiment, first buried oxide layer 120 and second oxide layer 150 may be bonded by first treating first buried oxide layer 120 and second oxide layer 150 to form one or more hydrophobic surfaces. For example, in an embodiment first buried oxide layer 120 and second oxide layer 150 may each be either exposed to a plasma or else etched using an etching solution of hydrogen fluoride (HF) or ammonium fluoride (NH4F). Once treated, the first buried oxide layer 120 and second oxide layer 150 are then aligned and placed in contact. First buried oxide layer 120 and second oxide layer 150 are then annealed to strengthen the bond.

However, the descriptions of fusion bonding using oxide layers, a cleaning process, or an etching solution as described above are merely examples of types of process that may be utilized in order to bond the first buried oxide layer 120 and second oxide layer 150, and are not intended to be limiting upon the embodiments. Rather, any suitable bonding process may alternatively be utilized to bond the first buried oxide layer 120 and second oxide layer 150, an for bonding the first wafer 500 to the second wafer 700, and all such processes are fully intended to be included within the embodiments.

Figure 9:
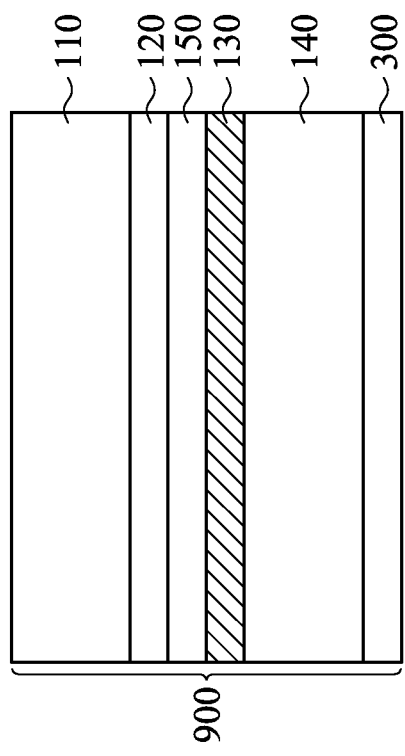

FIG. 9 representatively illustrates removal of dummy substrate 200 to form thinned wafer 900, in accordance with some embodiments. After wafer bonding, bonded wafers 800 may be subjected to a grinding process or a planarization process (e.g., chemical mechanical polishing), starting with the back surface of first wafer 500. The grinding/planarization process may be adapted to either remove the dummy substrate 200 in total or else, in another embodiment, to leave about 50 μm of the material of the dummy substrate 200 over stop layer 300. The residual material may be subsequently subjected to a dry polishing process.

Thereafter, a first etch process may be performed to remove the residual material of the dummy substrate 200, and expose stop layer 300. In some embodiments the first etch process may be a wet etch process that utilizes liquid etchants that are selective to the material of dummy substrate 200 without significantly removing the material of the underlying stop layer 300. In a particular embodiment in which the dummy substrate 200 is silicon and the stop layer 300 is silicon germanium, the liquid etchant that is selective to the material of the dummy substrate 200 may be an etchant such as tetramethylammonium hydroxide (TMAH) in solution at a concentration of between about 5% and about 25%. However, any suitable etching process, such as a dry etching process, may also be utilized.

In another embodiment the dummy substrate 200 is removed not through a grinding and etching process (such as described above), but through a cleavage process. For example, in one embodiment a cleave plane (not separately illustrated) such as an implanted layer, a porous layer, or a strain layer, may be formed and then cleaved in order to separate the dummy substrate 200. However, by utilizing the grinding and etching process, accidental cleavage of the dummy substrate 200 at the gettering layer 130 may be avoided.

After dummy substrate 200 is entirely removed and stop layer 300 has been exposed, stop layer 300 may be removed using a second etch process. In an embodiment the second etch process may be, e.g., a wet etch process that utilizes liquid etchants that are selective to the material of stop layer 300 (e.g., silicon germanium (SiGe)) without significantly removing the material of the underlying epitaxial layer 140. In an particular embodiment in which the stop layer 300 is silicon germanium and the epitaxial layer 140 is silicon, the liquid etchant that is selective to the material of the epitaxial layer 140 may be an etchant such as a solution of $HNO_3$:$H_2O$:dHF (0.5%) at a ratio of about 40:20:5. However, any suitable etching process, such as a dry etching process, may also be utilized.

Once the surface of epitaxial layer 140 has been exposed, the exposed surface of epitaxial layer 140 may be polished and cleaned to produce the silicon on insulator structure 100 (e.g., as representatively illustrated in FIG. 1). Additionally, once prepared, the silicon on insulator structure 100 may be utilized as a substrate for the fabrication of active devices (e.g., transistors) and passive devices (e.g., resistors, etc.), along with their corresponding interconnect structures. However, any suitable devices may be utilized.

Figure 10:
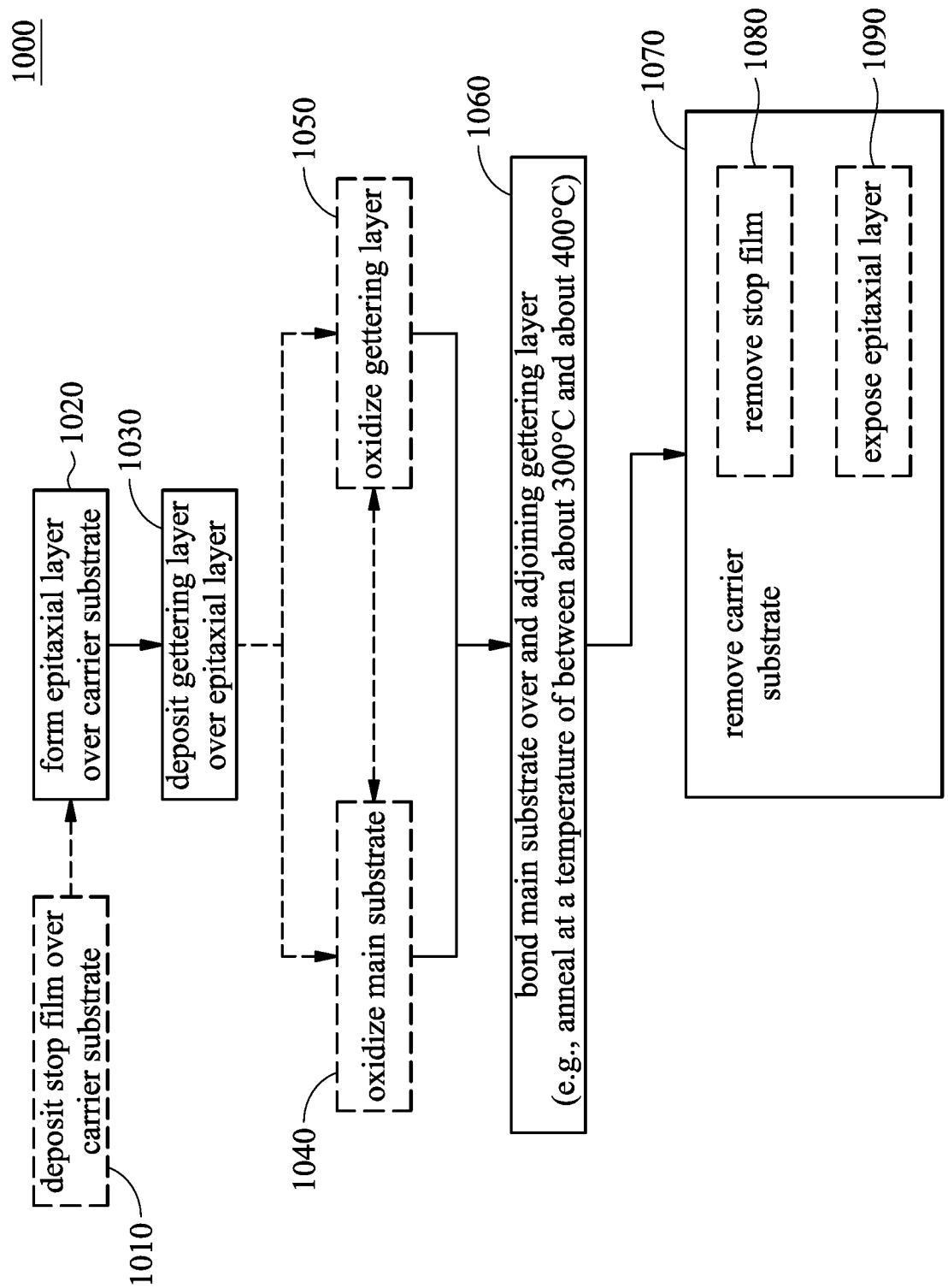
FIG. 10 and FIG. 11 illustrate flowcharts of representative methods, in accordance with some embodiments.

FIG. 10 representatively illustrates a method 1000 of forming a silicon on insulator wafer, in accordance with some embodiments. Method 1000 begins with a step 1010 of optionally depositing a stop film (e.g., stop layer 300) over a carrier substrate (e.g., dummy substrate 200), as representatively illustrated, e.g., in FIG. 3. In step 1020, an epitaxial layer (e.g., epitaxial layer 140) is formed over the carrier substrate (e.g., dummy substrate 200), as representatively illustrated, e.g., in FIG. 4. Thereafter, in step 1030, a gettering layer (e.g., gettering layer 130) is deposited over the epitaxial layer (e.g., epitaxial layer 140), as representatively illustrated, e.g., in FIG. 5. In step 1040, a main substrate (e.g., bulk main substrate 600) is optionally oxidized to form an oxide layer (e.g., first buried oxide layer 120), as representatively illustrated, e.g., in FIG. 7. Step 1040 is optional inasmuch as, in some embodiments, the main substrate may be provided with an oxide layer already formed therein. In step 1050, the gettering layer (e.g., gettering layer 130) may be optionally oxidized to improve subsequent adhesion to the oxide layer (e.g., first buried oxide layer 120) of the main substrate. Thereafter, in step 1060, the main substrate (e.g., second wafer 700) is bonded over, on, and adjoining the gettering layer (e.g., gettering layer 130 of first wafer 500), as representatively illustrated, e.g., in FIG. 8. The bonding (e.g., step 1060 of FIG. 10) may include an annealing process performed at a temperature of between about 300° C. and about 400° C. In step 1070, the carrier substrate (e.g., dummy substrate 200) is removed. Removal (e.g., step 1070 of FIG. 10) of the carrier substrate (e.g., dummy substrate 200) may optionally include a step 1080 of removing the optional stop film (e.g., stop layer 300). Removal (e.g., step 1070 of FIG. 10) of the carrier substrate (e.g., dummy substrate 200) may also optionally include a step 1090 of exposing the epitaxial layer (e.g., epitaxial layer 140).

Figure 11:
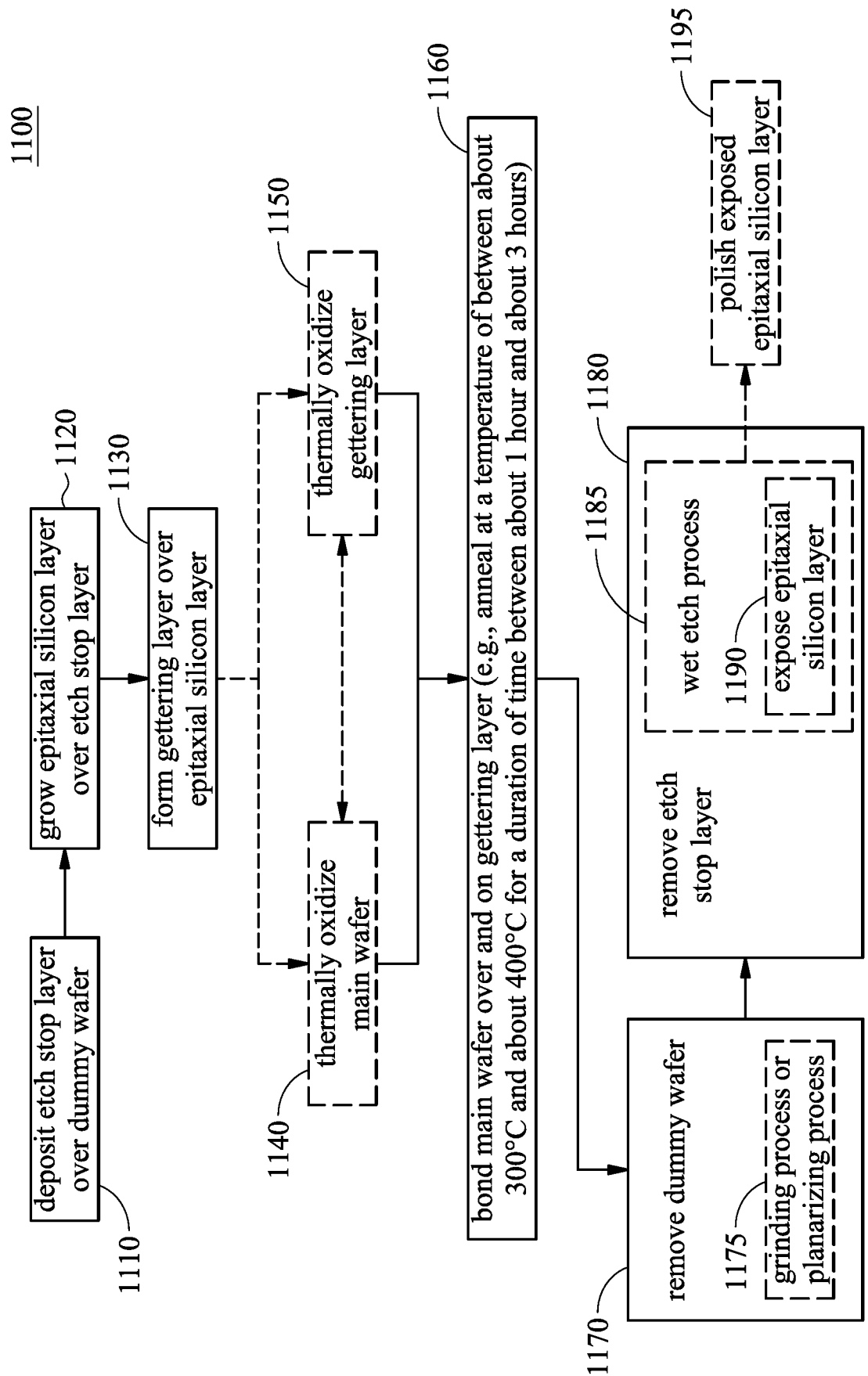

FIG. 11 representatively illustrates a method 1100 of forming a silicon on insulator wafer, in accordance with other embodiments. Method 1100 begins with a step 1110 of depositing an etch stop layer (e.g., stop layer 300) over a dummy wafer (e.g., dummy substrate 200), as representatively illustrated, e.g., in FIG. 3. In step 1120, an epitaxial silicon layer (e.g., epitaxial layer 140) is formed over the etch stop layer (e.g., stop layer 300), as representatively illustrated, e.g., in FIG. 4. Thereafter, in step 1130, a gettering layer (e.g., gettering layer 130) is formed over the epitaxial silicon layer (e.g., epitaxial layer 140), as representatively illustrated, e.g., in FIG. 5. In step 1140, a main wafer (e.g., bulk main substrate 600) is optionally thermally oxidized to form an oxide layer (e.g., first buried oxide layer 120), as representatively illustrated, e.g., in FIG. 7. Step 1140 is optional inasmuch as, in some embodiments, the main wafer may be provided with an oxide layer already formed therein. In optional step 1150, the gettering layer (e.g., gettering layer 130) is thermally oxidized to improve subsequent adhesion to the oxide layer (e.g., first buried oxide layer 120). Thereafter, in step 1160, the oxide layer (e.g., first buried oxide layer 120) of the main wafer (e.g., second wafer 700) is bonded over, on, and adjoining the gettering layer (e.g., gettering layer 130 of first wafer 500), as representatively illustrated, e.g., in FIG. 8. The bonding (e.g., step 1160 of FIG. 11) may include an annealing process at a temperature of between about 300° C. and about 400° C. for a duration of time between about 1 hour and about 3 hours. In step 1170, the dummy wafer (e.g., dummy substrate 200) is removed. Removal (e.g., step 1170 of FIG. 11) of the dummy wafer (e.g., dummy substrate 200) may optionally include a step 1175 of a grinding process or a planarizing process. In step 1180, the etch stop layer (e.g., stop layer 300) is removed. Removal (e.g., step 1180 of FIG. 11) of the etch stop layer (e.g., stop layer 300) may optionally include a step 1185 of a wet etch process. The wet etch process (e.g., step 1185 of FIG. 11) may optionally include a step 1190 of exposing the epitaxial silicon layer (e.g., epitaxial layer 140). Thereafter, a step 1195 of optionally polishing the exposed epitaxial silicon layer may be performed.

Various embodiments presented herein may provide several advantages. For example, the metal gettering ability of a silicon on insulator wafer may be enhanced or otherwise improved with the provision of a gettering layer interposed between an epitaxial silicon layer and a buried oxide layer, thereby helping to reduce the metal contamination (e.g., tungsten, aluminum, tin, etc.) at the surface of the active layer to a level below about $1\times10^9$ atoms/cm². Additionally, aggregate thermal budgets for device manufacture may be reduced. Additionally, a metal gettering layer can be embedded into a silicon on insulator wafer as part of the integration solution. Additionally, pre-processing steps to form bulk micro defects (BMD) can be eliminated or otherwise reduced. Additionally, the embedded gettering structures and methods described herein would provide improved metal gettering ability from initial provision of the silicon on insulator wafer. Additionally, improved relative proximity of metal gettering (for example, with metals having low diffusion rates; e.g., W, Al, Sn, or the like) may be achieved with the gettering layer being disposed near device fabrication regions. Additionally, metal on the surface of a silicon on insulator wafer may be eliminated or otherwise reduced. Additionally, concentrations of metal contaminants in an epitaxial silicon layer of a silicon on insulator (SOI) substrate may be reduced to fewer than about 1E9 atom/cm³ using embedded gettering structures and methods as representatively disclosed herein.

In accordance with an embodiment, a method of manufacturing a silicon-on-insulator (SOI) substrate includes forming an epitaxial layer over a first substrate; depositing a gettering layer over the epitaxial layer; bonding a second substrate to the gettering layer, wherein the second substrate comprises an insulating layer, and the insulating layer adjoins the gettering layer after bonding the second substrate; and removing the first substrate. In an embodiment the method further includes oxidizing the second substrate to form the insulating layer prior to the bonding the second substrate to the gettering layer, wherein after the bonding the second substrate to the gettering layer, the insulating layer is interposed between an unoxidized portion of the second substrate and the gettering layer. In an embodiment the method further includes oxidizing the gettering layer prior to the bonding the second substrate. In an embodiment the bonding the second substrate comprises an annealing process performed at a temperature of between about 300° C. and about 400° C. In an embodiment the method further includes, prior to the forming the epitaxial layer, depositing a stop film over the first substrate. In an embodiment the stop film is interposed between and adjoins the first substrate and the epitaxial layer. In an embodiment the removing the first substrate comprises removing the stop film, and exposing the epitaxial layer.

In another embodiment, a method of manufacturing a silicon-on-insulator (SOI) substrate includes depositing an etch stop layer over a dummy wafer; growing an epitaxial silicon layer over the etch stop layer; forming a gettering layer over the epitaxial silicon layer; bonding an oxide layer of a main wafer to an oxidized portion of the gettering layer; after bonding the oxide layer of the main wafer, removing the dummy wafer; and after removing the dummy wafer, removing the etch stop layer. In an embodiment the depositing the etch stop layer comprises depositing silicon germanium; and the forming the gettering layer comprises forming one of polysilicon, silicon nitride, silicon oxynitride, or silicon germanium. In an embodiment the method further includes thermally oxidizing the gettering layer prior to the bonding the oxide layer of the main wafer. In an embodiment the method further includes thermally oxidizing the main wafer to form the oxide layer prior to the bonding the oxide layer of the main wafer. In an embodiment the bonding the oxide layer of the main wafer comprises annealing at a temperature of between about 300° C. and about 400° C. for a duration of time between about 1 hour and about 3 hours. In an embodiment removing the dummy wafer comprises at least one of a grinding process or a planarizing process. In an embodiment removing the etch stop layer comprises a wet etch process.

In still another embodiment, a semiconductor device includes a silicon substrate having a buried oxide layer; a gettering layer adjoining the buried oxide layer; and an epitaxial silicon layer adjoining the gettering layer, wherein the gettering layer is interposed between the buried oxide layer and the epitaxial silicon layer. In an embodiment the gettering layer comprises a first material and the buried oxide layer comprises an oxide of the first material. In an embodiment the gettering layer comprises polysilicon. In an embodiment the gettering layer comprises a nitride material. In an embodiment the gettering layer comprises silicon oxynitride. In an embodiment the gettering layer comprises silicon germanium.

The foregoing outlines features of several embodiments so that those skilled in the art may better understand aspects of the present disclosure. Skilled artisans will appreciate that they may readily use the present disclosure as a basis for designing or modifying other processes or structures for carrying out same or similar purposes, or for achieving same or similar advantages of embodiments discussed herein. Those skilled in the art will also appreciate that such equivalent constructions do not depart from the spirit and scope of the present disclosure, and that various changes, substitutions, or alterations may be made without departing from the spirit and scope of the present disclosure.

What is claimed is:

1. A semiconductor device comprising:
   a silicon substrate;
   a buried oxide layer;
   a gettering layer in physical contact with the buried oxide layer, the gettering layer comprising an oxidized portion and an unoxidized portion, wherein a bonding interface is present between the buried oxide layer and the oxidized portion, and wherein the oxidized portion comprises a first material throughout the oxidized portion, and wherein the unoxidized portion comprises a second material through the unoxidized portion; and
   an epitaxial silicon layer in physical contact with the gettering layer, wherein the gettering layer is interposed between the buried oxide layer and the epitaxial silicon layer.

2. The semiconductor device of claim 1, wherein the gettering layer comprises a first material adjacent to the oxidized portion and the buried oxide layer comprises an oxide of the first material.

3. The semiconductor device of claim 1, wherein the gettering layer comprises polysilicon.

4. The semiconductor device of claim 1, wherein the gettering layer comprises a nitride material.

5. The semiconductor device of claim 1, wherein the gettering layer comprises silicon oxynitride.

6. The semiconductor device of claim 5, wherein the silicon oxynitride has a nitrogen concentration between about 1E20 atoms/cm$^3$ to about 1E22 atoms/cm$^3$ and has an oxygen concentration between about 1E22 atoms/cm$^3$ and about 1E24 atoms/cm$^3$.

7. The semiconductor device of claim 1, wherein the gettering layer comprises silicon germanium.

8. A semiconductor device comprising:
   a gettering layer, the gettering layer comprising an oxidized portion and an unoxidized portion, the oxidized portion comprising a first material with a first composition throughout the oxidized portion, the unoxidized portion comprising a second material with a second composition throughout the unoxidized portion;
   an oxide layer bonded to the oxidized portion;
   an active layer in physical contact with the unoxidized portion on an opposite side of the gettering layer from the oxide layer; and
   a silicon substrate adjacent to the oxide layer, wherein a bonding interface between the oxide layer and the oxidized portion has a width at least as large as the silicon substrate.

9. The semiconductor device of claim 8, wherein the gettering layer comprises silicon nitride.

10. The semiconductor device of claim 9, wherein the silicon nitride has a nitrogen concentration between about 1E22 atoms/cm$^3$ to about 1E24 atoms/cm$^3$.

11. The semiconductor device of claim 8, wherein the gettering layer comprises silicon oxynitride.

12. The semiconductor device of claim 11, wherein the silicon oxynitride has a nitrogen concentration between about 1E20 atoms/cm$^3$ to about 1E22 atoms/cm$^3$ and has an oxygen concentration between about 1E22 atoms/cm$^3$ and about 1E24 atoms/cm$^3$.

13. The semiconductor device of claim 8, wherein the silicon substrate comprises boron.

14. The semiconductor device of claim 13, wherein the silicon substrate has a boron concentration between about 5E15 atoms/cm$^3$ and about 6E18 atoms/cm$^3$.

15. A semiconductor device comprising:
   an epitaxial layer;
   a gettering layer in physical contact with the epitaxial layer, the gettering layer comprising:
      a first layer comprising a first set of elements; and
      a second layer comprising the first set of elements and oxygen throughout the second layer;
   an oxide layer bonded to the second layer; and
   a substrate in physical contact with the oxide layer, wherein the oxide layer is located along multiple sides of the substrate, wherein at least two of the multiple sides are perpendicular with a third side.

16. The semiconductor device of claim 15, wherein the second layer has a thickness of between about 2000 Å and about 5000 Å.

17. The semiconductor device of claim 15, wherein the oxide layer has a thickness of between about 2000 Å and about 5000 Å.

18. The semiconductor device of claim 17, wherein the oxide layer has a thickness of between about 2000 Å and about 3500 Å.

19. The semiconductor device of claim 15, wherein the first layer is silicon nitride.

20. The semiconductor device of claim 19, wherein the silicon nitride has a nitrogen concentration between about 1E22 atoms/cm$^3$ to about 1E24 atoms/cm$^3$.

* * * * *